United States Patent [19]
Blanchard

[11] Patent Number: 6,046,473
[45] Date of Patent: Apr. 4, 2000

[54] STRUCTURE AND PROCESS FOR REDUCING THE ON-RESISTANCE OF MOS-GATED POWER DEVICES

[75] Inventor: Richard A. Blanchard, Los Altos, Calif.

[73] Assignee: STMicroelectronics, Inc., Carrollton, Tex.

[21] Appl. No.: 08/905,754

[22] Filed: Aug. 4, 1997

Related U.S. Application Data

[63] Continuation of application No. 08/481,071, Jun. 7, 1995, abandoned.

[51] Int. Cl.⁷ .................................. H01L 29/76
[52] U.S. Cl. ............................ 257/341; 257/342
[58] Field of Search ..................... 257/341, 342

[56] References Cited

U.S. PATENT DOCUMENTS

| | | | |
|---|---|---|---|
| 3,271,640 | 9/1966 | Moore | 317/235 |
| 3,319,311 | 5/1967 | Mutter | 29/253 |
| 3,414,781 | 12/1968 | Dill | 317/235 |
| 3,458,781 | 7/1969 | Simon | 317/235 |

(List continued on next page.)

FOREIGN PATENT DOCUMENTS

| | | | |
|---|---|---|---|
| 0 050 773 | 5/1982 | European Pat. Off. | H01L 29/06 |
| 0119400 | 9/1984 | European Pat. Off. | |
| 2136509 | 11/1972 | Germany . | |
| 48-40814 | 12/1973 | Japan . | |
| 50-46081 | 4/1975 | Japan . | |
| 51-48981 | 4/1976 | Japan . | |
| 51-85381 | 7/1976 | Japan . | |
| 52-23277 | 2/1977 | Japan . | |
| 52-42080 | 4/1977 | Japan . | |
| 52-106688 | 9/1977 | Japan . | |
| 53-66181 | 6/1978 | Japan . | |
| 53-74385 | 7/1978 | Japan . | |
| 53-74386 | 7/1978 | Japan . | |
| 53-135284 | 11/1978 | Japan . | |
| 54-885 | 1/1979 | Japan . | |
| 54-57871 | 5/1979 | Japan . | |
| 55-85073 | 6/1980 | Japan . | |
| 55-93270 | 7/1980 | Japan . | |
| 57-42164 | 9/1982 | Japan . | |
| 58-68979 | 4/1983 | Japan | 257/342 |
| 62-025457 | 2/1987 | Japan | H01L 29/78 |
| 63-021876 | 1/1988 | Japan | H01L 29/78 |
| 62-160612 | 1/1989 | Japan | H01L 29/78 |
| 5-055589 | 3/1993 | Japan | H01L 29/784 |
| 1153428 | 5/1969 | United Kingdom . | |
| 1224335 | 3/1971 | United Kingdom . | |
| 1372086 | 10/1974 | United Kingdom . | |
| 1390135 | 4/1975 | United Kingdom . | |
| 1400574 | 7/1975 | United Kingdom . | |
| 1455840 | 11/1976 | United Kingdom . | |
| 1465244 | 2/1977 | United Kingdom . | |

OTHER PUBLICATIONS

Hu, "A Parametric Study of Power Mosfets," *IEEE*, 385–395, Mar. 1979.

Baliga, *Modern Power Devices*, ed. John Wiley & Sons, 272–274, 291–300, Jan. 1987.

Darwish, "Optimization of Breakdown Voltage and On-Resistance of VDMOS Transistors," *IEEE Transactions on Electron Devices* ED–31(12):1769–1773, Dec. 1984.

Yoshida et al., "A High Power MOSFET With a Vertical Drain Electrode and a Meshed Gate Structure," *IEEE J. Solid–State Circuits* SC–11:472–477, Aug. 1976.

Plummer et al., "A Monolithic 200–V CMOS Analog Switch," *IEEE J. Solid–State Circuit* SC–11(6), 809–817, Dec. 1976.

(List continued on next page.)

*Primary Examiner*—Mark V. Prenty
*Attorney, Agent, or Firm*—David V. Carlson; Theodore E. Galanthay; Lisa K. Jorgenson

[57] ABSTRACT

A VDMOS structure with an added n– doping component, and a LOCOS oxide self-aligned to it, at tie surface extension of the drain. The additional shallow n– component permits the body diffusion to be heavier, and hence reduces the risk of latchup.

5 Claims, 7 Drawing Sheets

U.S. PATENT DOCUMENTS

| | | | |
|---|---|---|---|
| 3,461,360 | 8/1969 | Barson et al. | 317/235 |
| 3,534,235 | 10/1970 | Bower et al. | 317/235 |
| 3,566,518 | 3/1971 | Brown et al. | 29/571 |
| 3,600,647 | 8/1971 | Gray | 317/235 |
| 3,619,740 | 11/1971 | Nakanuma et al. | 317/235 |
| 3,631,312 | 12/1971 | Moyle et al. | 317/235 |
| 3,650,019 | 3/1972 | Robinson | 29/571 |
| 3,719,535 | 3/1973 | Zoroglu | 148/187 |
| 3,739,237 | 6/1973 | Shannon | 317/235 |
| 3,749,985 | 7/1973 | Dawson | 317/235 |
| 3,764,396 | 10/1973 | Tarui et al. | 148/1.5 |
| 3,786,319 | 1/1974 | Tomisaburo | 317/235 |
| 3,821,776 | 6/1974 | Hayashi et al. | 357/23 |
| 3,845,495 | 10/1974 | Cauge et al. | 357/23 |
| 3,849,216 | 11/1974 | Salters | 148/187 |
| 3,863,330 | 2/1975 | Kraybill et al. | 29/571 |
| 3,909,320 | 9/1975 | Gauge et al. | 148/187 |
| 3,950,777 | 4/1976 | Tarui et al. | 357/23 |
| 3,986,903 | 10/1976 | Watrous, Jr. | 148/187 |
| 4,001,860 | 1/1977 | Cauge et al. | 357/23 |
| 4,003,071 | 1/1977 | Takagi | 357/42 |
| 4,007,478 | 2/1977 | Yagi | 357/41 |
| 4,015,278 | 3/1977 | Fukuta | 357/22 |
| 4,055,884 | 11/1977 | Jambotkar | 29/571 |
| 4,070,690 | 1/1978 | Wickstrom | 357/68 |
| 4,072,975 | 2/1978 | Ishitani | 357/23 |
| 4,101,922 | 7/1978 | Tihanyi et al. | 357/23 |
| 4,142,197 | 2/1979 | Dingwall | 357/23 |
| 4,145,700 | 3/1979 | Jambotkar | 357/23 |
| 4,148,047 | 4/1979 | Hendrickson | 357/23 |
| 4,173,022 | 10/1979 | Dingwall | 357/23 |
| 4,190,850 | 2/1980 | Tihanyi et al. | 357/23 |
| 4,233,615 | 11/1980 | Takemoto et al. | 357/22 |
| 4,344,081 | 8/1982 | Pao et al. | 357/43 |
| 4,345,265 | 8/1982 | Blanchard | 357/23 |
| 4,393,391 | 7/1983 | Blanchard | 357/23 |
| 4,402,003 | 8/1983 | Blanchard | 357/43 |
| 4,593,302 | 6/1986 | Lidow et al. | 357/23.4 |
| 4,642,666 | 2/1987 | Lidow et al. | 357/23.4 |
| 4,667,393 | 5/1987 | Ferla | 29/576 |
| 4,680,853 | 7/1987 | Lidow et al. | 29/571 |
| 4,705,759 | 11/1987 | Lidow et al. | 437/29 |
| 4,791,462 | 12/1988 | Blanchard | 357/23.4 |
| 4,893,160 | 1/1990 | Blanchard | 357/23.4 |
| 4,896,196 | 1/1990 | Blanchard | 357/23.4 |
| 4,902,636 | 2/1990 | Akiyama et al. | 437/45 |
| 4,914,058 | 4/1990 | Blanchard | 437/203 |
| 4,929,991 | 5/1990 | Blanchard | 357/23.8 |
| 4,952,992 | 8/1990 | Blanchard | 357/23.4 |
| 4,956,700 | 9/1990 | Blanchard | 357/23.4 |
| 4,959,699 | 9/1990 | Lidow et al. | 357/23.7 |
| 4,983,535 | 1/1991 | Blanchard | 437/40 |
| 5,008,725 | 4/1991 | Lidow et al. | 357/23.4 |
| 5,015,593 | 5/1991 | Yawata et al. | 437/25 |
| 5,034,785 | 7/1991 | Blanchard | 357/23.4 |
| 5,130,767 | 7/1992 | Lidow et al. | 357/23.4 |
| 5,338,961 | 8/1994 | Lidow et al. | 257/342 |
| 5,468,654 | 11/1995 | Harada | 437/6 |
| 5,545,908 | 8/1996 | Tokura et al. | 257/341 |
| 5,869,371 | 2/1999 | Blanchard | 438/273 |

OTHER PUBLICATIONS

Scharf et al. "A MOS–Controlled Triac Device," IEEE International Solid–State Circuits Conference, San Francisco, Calif., Feb. 15–17, 1978, p. 222–223.

Lisiak et al., "Optimization of Nonplanar Power MOS Transistors," *IEEE Transactions on Electron Devices Ed–25*(10):1229–1234, Oct. 1978.

Sigg et al., "D–MOS Transistor for Microwave Applications," *IEEE Transactions on Electron Devices ED–19*(1):45–53, Jan. 1972.

Cady et al., "Integration Technique for Closed Field–Effect Transistors," *IBM Technical Disclosure Bulletin 16*(11):3519–3520, Apr. 1974.

Lin et al., "Optimum Load Device for DMOS Integrated Circuits," *IEEE J. Solid–State Circuits SC–11*(4):443–452, Aug. 1976.

Collins et al., "New Technology–HEXFET, a new power technology, cutson–resistance, boosts ratings," *Electronic Design,* Jun. 7, 1979 (8 pgs.).

Sun et al., "Modeling of the On–Resistance of LDMOS, VDMOS, and VMOS Power Transistors," *IEEE Transactions on Electronic Devices* 27:356–367, Feb. 1980.

Tarui et al., "Diffusion Self–Aligned MOST: A New Approach for High Speed Device," Proc. 1st Conf. Solid State Devices, Tokyo, 1969, Supplement to the *J. Jap. Applied Physics 39*:105–110, Jan. 1970.

Pocha et al., "A Computer–Aided Design Model for High–Voltage Double Diffused MOS (DMOS) Transistors," *IEEE J. Solid–State Circuits SC–11*(5):718–726, Oct. 1976.

Leistiko, Jr. et al., "Breakdown Voltage of PlanarSilicon Junctions," *Solid State Electronics,* Pergamon Press, 1966, vol. 9, 847–852, printed in Great Britain, Jan. 1976.

Rodgers et al., *IEEE Solid–State Circuits SC–*10(5):322–331, Oct. 1975.

Stone et al., "Recent Advantages in Ion Implantation—A State of the Art Review," *Solid State Technology,* 35–44, Jun. 1976.

Duchynski, R.J., "Ion Implantation for Semiconductor Devices," *Solid State Technology,* 53–58, Nov. 1977.

Sansbury, J., "Applications of Ion Implantation in Semiconductor Processing," *Solid State Technology,* 31–37, Nov. 1976.

STRUCTURE AND PROCESS FOR REDUCING THE ON-RESISTANCE OF MOS-GATED POWER DEVICES

CROSS-REFERENCE TO RELATED APPLICATION

This application is a continuation of U.S. patent application Ser. No. 08/481,071, filed Jun. 7, 1995 now abandoned.

BACKGROUND AND SUMMARY OF THE INVENTION

The present invention relates to DMOS-type power transistors, and particularly to such transistors which provide vertical current flow.

Vertical-current DMOS-type power transistors have become an increasingly dominant technology for solid-state power-switching devices. In the basic technology of such transistors, a heavily doped n+ source region is separated from a surface extension of the drain (normally n-type) by a relatively narrow p-type channel region (which is normally outdiffused from the same pattern as the source diffusion). A gate (typically polysilicon) is capacitively coupled to the channel region to controllably invert it. When the channel is inverted, electrons flow from the source region through the channel into the surface extension of the drain and thence downward through a drain conduction region to eventually reach an n+ drain. The drain may be at the back surface, or may be a buried layer in integrated power processes. The general characteristics of such devices are discussed in the following texts, all of which are hereby incorporated by reference: B. E. Taylor, POWER MOSFET DESIGN (1993); B. J. Baliga, MODERN POWER DEVICES (1987); Grant and Gowar, POWER MOSFETS: THEORY AND APPLICATIONS (1989); and E. Oxner, POWER FETs AND THEIR APPLICATIONS, (1982).

On-Reistance

The on-resistance per unit area of a MOS-gated power device is very important, since it determines the silicon area required to obtain a specified device resistance. However, there is a tradeoff between breakdown voltage and on-resistance. Thus as the breakdown voltage of the device increases, the silicon area required to get the on-resistance down to a specific target value increases rapidly. See generally Darwish and Board, "Optimization of Breakdown Voltage and on-resistance of VDMOS transistors," 31 IEEE TRANS'NS ELECTRON DEVICES 1769 (1984), which is hereby incorporated by reference.

A number of techniques have been developed to minimize the on-resistance by increasing the doping concentration of the drain region below the gate. (If this added doping concentration is sufficiently light and shallow, it will not degrade the breakdown voltage of the device.) One technique uses lateral diffusion of dopants into the surface drain region; another uses implantation into the surface drain region.

Field-Plate-Induced Breakdown

One of the possible breakdown mechanisms in high-voltage MOS transistors is field-plate-induced breakdown, in which the potential on a field plate above a heavily doped region causes a "breakdown" in the heavily doped region, with a consequent high current flow between electrodes which contact the doped region. This effect is described and analyzed in Declercq and Plummer, "Avalanche breakdown in high-voltage D-MOS devices," 23 IEEE TRANSACTIONS ON ELECTRON DEVICES 1 (1976), which is hereby incorporated by reference.

Figure 3A:
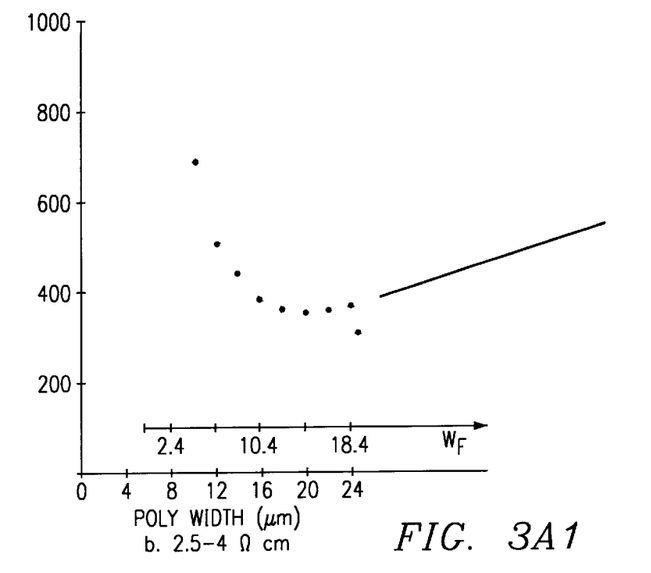
Figure 3A:
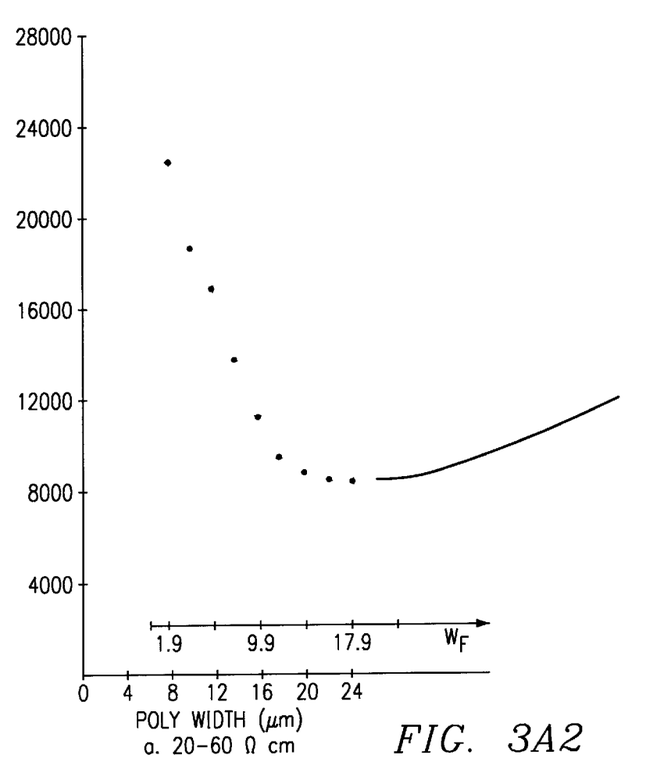
Figure 3B:
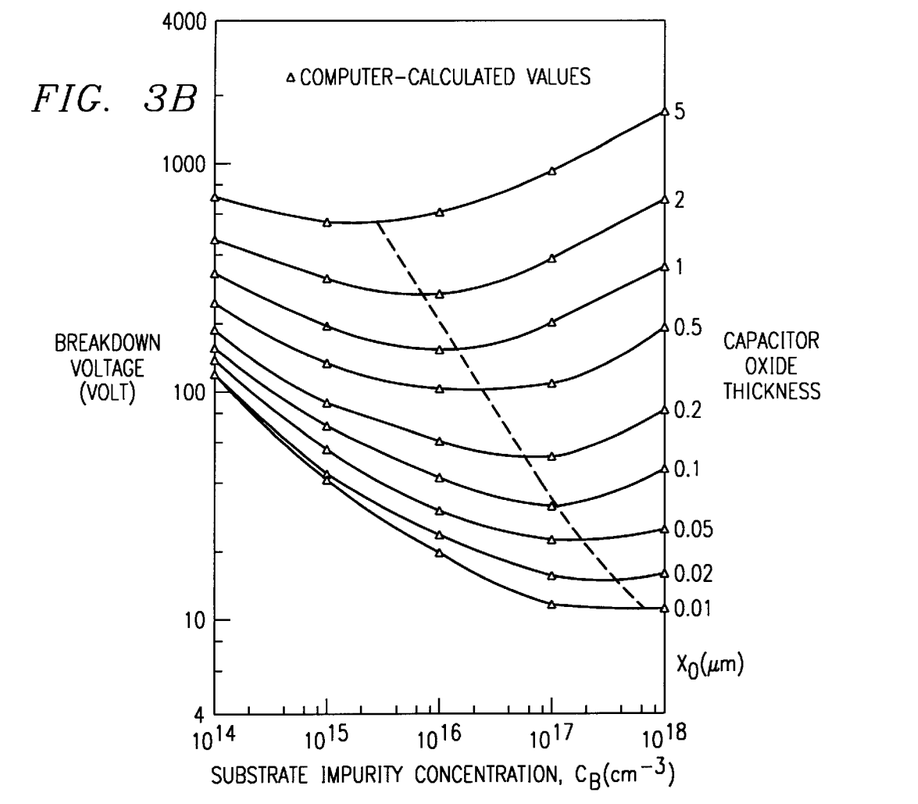
FIG. 3B indicates the shape of the relation between breakdown voltage and lateral cell spacing, for two different values of body doping.

As seen in FIG. 3B the breakdown voltage (for a given oxide thickness under the field plate) therefore has a minimum value at some moderate level of doping, and increases at lower or high doping levels.

Optimal Spacing

For devices with high power-handling capability, many transistor cells are packed in an array. The lateral spacing between cells in the array therefore has a large influence on the overall current density which can be achieved. Published analyses have indicated that there is an optimal spacing, for a given set of device parameters, which will minimize on-resistance. Moreover, this spacing is dependent on the background doping seen at the surface of the VDMOS device.

FIGS. 3A1 and 3A2 indicates the shape of the relation between breakdown voltage and lateral cell spacing, for two different values of body doping. As these curves show, the optimal spacing is lower for higher background dopant concentrations (at least within the range of background dopant concentrations which might be considered for normal device use). See generally Hu, "A Parametric Study of Power MOSFETS," IEEE POWER ELECTRONICS SPECIALISTS CONFERENCE RECORD 385 (1979).

Gate Capacitance of Power FETs

The gate of a large insulated-gate device is a lattice which may run over a very large area of silicon (particularly in discrete devices). In analyzing turn-on and turnoff of such devices, the RC tine constant of the gate must be carefully considered: if the applied gate voltage is switched within a duration less than this time constant, then different parts of the gate may have significantly different transient voltage levels, and some parts of the transistor may be on while others are off. This may cause "hot-spotting" or other undesirable effects to occur.

The RC time constant of the gate can be reduced by making metal contact to the gate in more places. This effectively reduces the "R" term in the time constant. However, each such contact consumes some gate area. Moreover, in single-level-metal processes, the requirements of making source contacts severely constrain the possible geometries for gate contacts.

A large part of the gate capacitance is unavoidable, since the gate must be closely coupled to the channel in order for the transistor to operate. However, the channel is only a small fraction of the surface area, and gate coupling to the source and body regions is not particularly necessary. (The source and body areas all have relatively high dopant concentrations, and hence provide high capacitance per unit area where the gate is capacitively coupled to these regions.)

Innovative Processes and Structures

The present application discloses two modifications to the familiar DMOS structures and processes, which-provide reduced on-resistance without increasing gate capacitance. These modifications are particularly advantageous in combination.

The first modification is a blanket shallow low-dose n-type implant at the surface of the device areas. This is preferably shallower than the source diffusion. This slightly counterdopes the channel region, so the concentration and/or diffusion length of the shallow p-type diffusion which surrounds the source can be slightly increased without degrading the transistor's on-resistance. This provides increased resistance to latchup in an integrated process (since the resistance of the intrinsic base of the parasitic npn is reduced).

A second modification is an added shallow n-type dopant contribution at the drain surface, which is preferably self-aligned to a LOCOS oxide. This combination provides several benefits:

1) The additional drain surface doping provides improved conductivity without degrading the breakdown voltage of the device.
2) Since the LOCOS oxide separates the gate from most of the drain diffusion, capacitive loading on the gate is minimized.
3) Lateral spacing between adjacent transistor cells is improved.
4) The added drain surface dopant follows the curve of the LOCOS oxide, which provides some downward extension while still using a very shallow diffusion profile. (A deeper dopant profile, due either to deeper implantation or longer diffusion length, would risk some degradation of the voltage standoff capability of the drain conduction region due to the lower-depth extension of the dopant distribution.)

To avoid field-plate-induced breakdown, both of the added doping contributions provide relatively small additional contributions (preferably a few times the background level), as detailed below.

BRIEF DESCRIPTION OF THE DRAWING

The disclosed inventions will be described with reference to the accompanying drawings, which show important sample embodiments of the invention and which are incorporated in the specification hereof by reference, wherein:

FIG. 3A1 and 3A2 indicate the shape of the relation between field-plate-induced breakdown voltage and doping, for two different oxide thicknesses.

DETAILED DESCRIPTION OF THE PREFERRED EMBODIMENTS

The numerous innovative teachings of the present application will be described with particular reference to specific sample embodiments (by way of example, and not of limitation). In particular, all stated quantitative limitations are merely illustrative, and do not imply any limits on the claim scope.

First Embodiment

FIGS. 1A–1G show a first sample embodiment, which is also the best mode as presently contemplated. In the illustrated structure, the left side indicates features of the array termination, while the right side shows an element in the array. (In general the device structure will include an array of transistor cells, surrounded by a termination structure which is designed to avoid the particular breakdown risks caused by lateral fields at the edge of the array.)

Figure 1A:
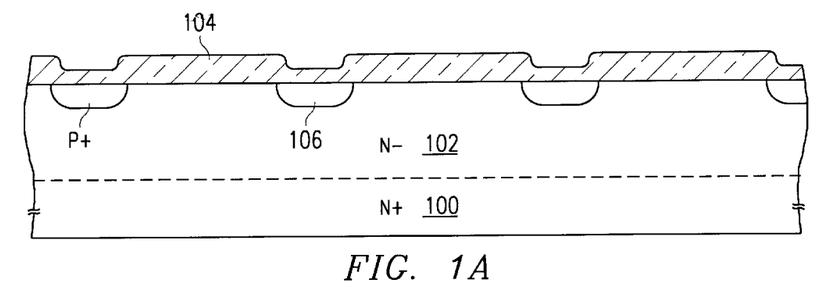
FIGS. 1A–1G show process steps in a first sample innovative embodiment.

The starting material is an n–on–n+ wafer with a surface doping concentration, in the epic layer 102, of e.g. 5 Ω-cm (or alternatively in the range of 0.5–50 Ω-cm). (The substrate 100 is heavily doped, e.g. to 0.001 or 0.0001 Ω-m.)

A field oxide 104 is now grown to a thickness of 0.5–1.5 μm (specifically e.g. 1 μm).

The field oxide 104 is patterned and etched, to expose desired locations of deep-body diffusions, and boron is now implanted to form p+ diffusions 106. (One of the illustrated diffusions 106, namely diffusion 106' at the left side of the drawing, will provide a field-limiting ring.) The implant uses a dose in the range of about 1E14 (i.e. $1\times10^{14}$) to 1E16 cm$^{-2}$ (specifically e.g. 1E15 cm$^{-2}$). The energy of this implant is selected, in relation to the background doping, to produce a junction depth in the range of 1.5 to 4.5 μm (specifically e.g. 3 μm).

The foregoing steps have produced the intermediate structure shown in FIG. 1A.

Figure 1B:
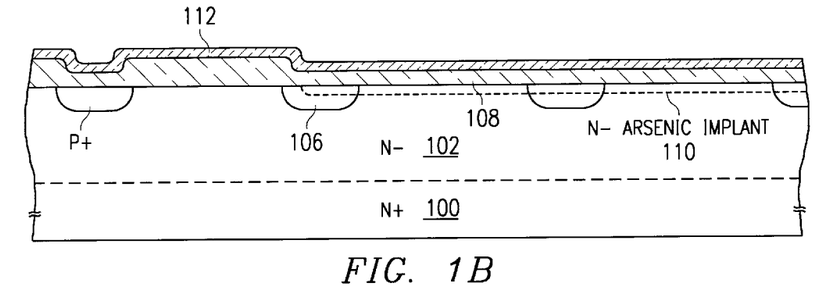

Next an "active" mask is used to etch the oxide 104 in a pattern which removes it from the array area.

A pad oxide 108 is now grown to a thickness of e.g. 500–1000 Å (specifically e.g. 700 Å).

A shallow n– arsenic implant is now performed, with a dose in the range of 1E11–5E13 cm$^{-3}$ (specifically e.g. 7E12 cm$^{-3}$), and an energy of e.g. 50 keV (or alternatively in the range of 25–200 keV). This provides an added surface doping concentration 110 (which of course is simply an addition to other doping components which are present). Optionally this implant can be performed before pad oxide growth, or after nitride deposition, with appropriate dose and/or energy changes in either case.

A silicon nitride layer 112 is now deposited to a thickness in the range of e.g. 500–1000 Å (specifically e.g. 700 Å). The two layers 108 and 112 together form an oxidation-resistant layer, and are jointly referred to as a "LOCOS stack."

The foregoing steps have produced the intermediate structure shown in FIG. 1B.

Figure 1C:
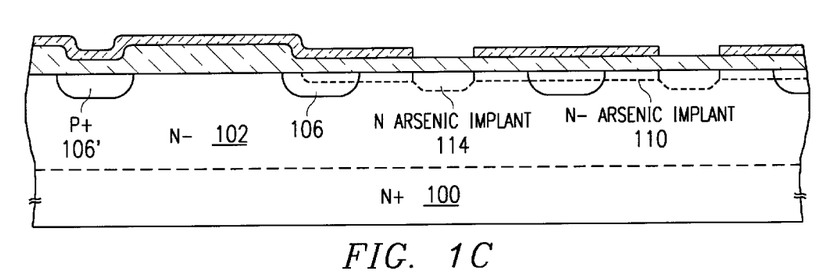

The nitride layer 112 is now patterned to expose desired drain locations, and a further arsenic implant is now performed. This implant is performed with a dose of e.g. 5E10–5E12 cm$^{-2}$. This provides a second additional doping contribution 114 in the drain locations.

The foregoing steps have produced the intermediate structure shown in FIG. 1C.

Figure 1D:
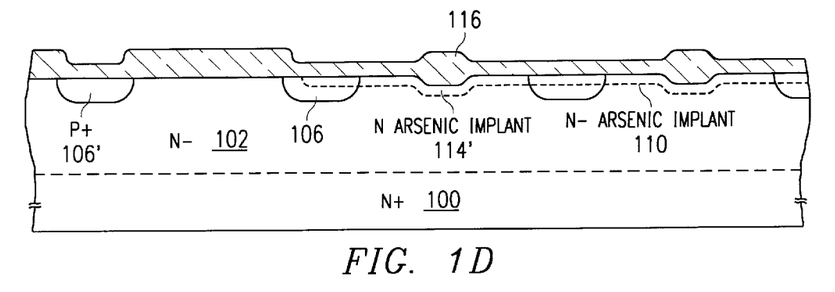

Oxidation is now performed, to form LOCOS oxide 116 to a thickness of e.g. 5000 Å (or alternatively in the range of 2000 Å-1 μm), and the nitride 112 is stripped.

Note that this oxidation step will modify the shape and concentration of diffusion 114, to produce a modified diffusion 114'. Some of the dopant will segregate into the growing oxide, and some will diffuse down ahead of the oxide growth. The result is a diffusion profile which is still relatively shallow, but is aligned to the oxide boundary.

The foregoing steps have produced the intermediate structure shown in FIG. 1D.

Figure 1E:
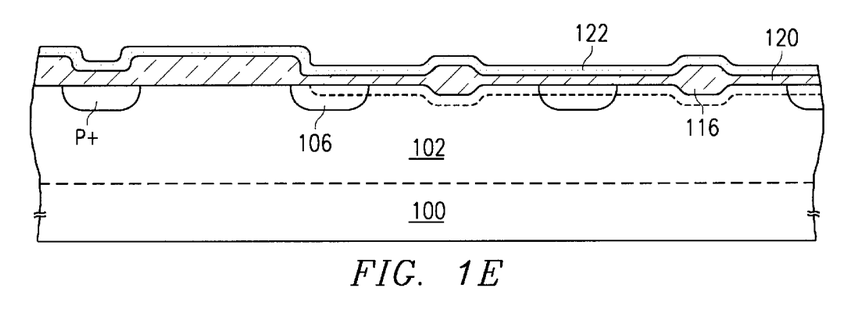

The remaining pad oxide 108 is now stripped, and a gate oxide 120 is grown to a thickness of e.g. 500–1500 Å (depending on operating voltage; specifically e.g. 1000 Å).

Polysilicon 122 is now deposited (and doped), to a thickness of e.g. 5000 Å (or alternatively in the range of 2000–10000 Å).

The foregoing steps have produced the intermediate structure shown in FIG. 1E.

Figure 1F:
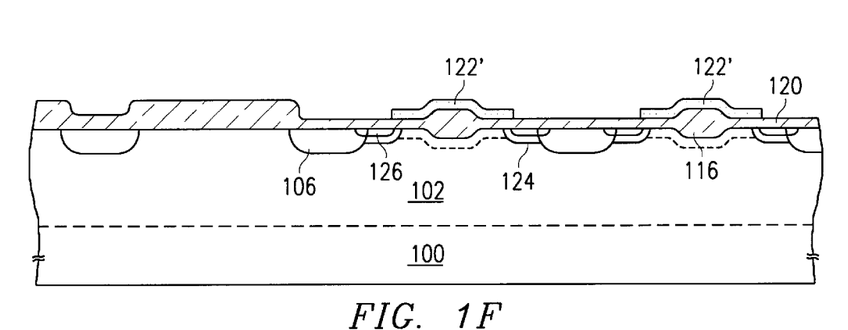

The polysilicon layer 122 is now patterned to provide an interconnected mesh of gates in the desired pattern.

P− body and n+ source implants are now performed. Both are global implants which (conventionally) are self-aligned to the polysilicon 122 and field oxide 104.

The body implant is performed with a boron dose of e.g. 5E13 to 5E14 cm$^{-2}$ (specifically e.g. 2E14 cm$^{-2}$), and an energy which eventually provides body regions 124 with a junction depth in the range of e.g. 0.8 to 3.0 μm (specifically e.g. 1.5 μm).

The source implant is performed with an arsenic dose of e.g. 5E14 to 1E16 cm$^{-2}$ (specifically e.g. 2E15 cm$^{-2}$), and an energy which eventually provides source regions 126 with a junction in the range of e.g. 0.4 to 2.0 μm (specifically e.g. 1.0 μm)

The foregoing steps have produced the intermediate structure shown in FIG. 1F. Two apparently separate polysilicon portions 122' are shown in FIG. 1F (although in fact these portions are not electrically separate): each of these portions, in the illustrated sectional view, includes two active gate portions (each capacitively coupled to a respective channel region), connected over a LOCOS oxide 116.

Figure 1G:
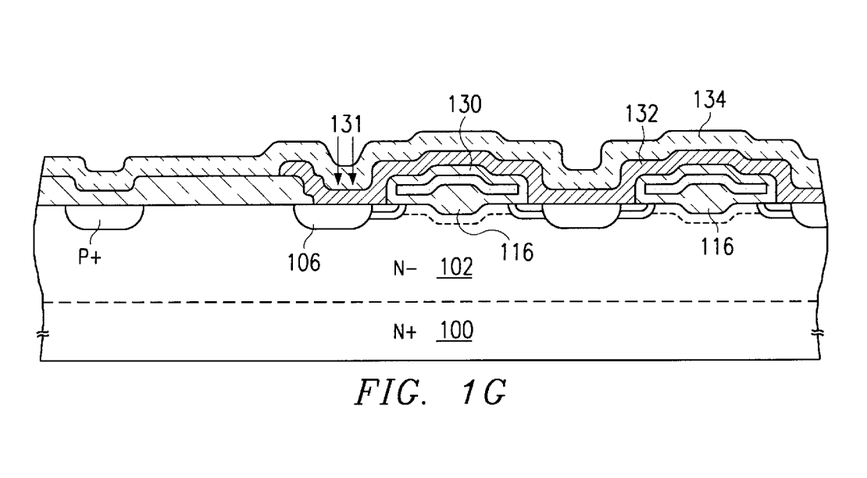

An internevel dielectric 130 is now deposited (e.g. 4000 Å of doped or undoped oxide). A TEOS-deposited oxide, or an oxide grown from polysilicon, can optionally be used for a first layer, e.g. of 1000–2000 Å thickness.

The internevel dielectric 130 is then patterned and etched to form contact holes 131 over source and body locations.

Metallization 132 is then deposited (e.g. 0.9 to 2.5 μm of AlSi$_{0.01}$Cu$_{0.01}$), and etched in a pattern which forms desired interconnections.

A passivation layer 134 is then deposited, e.g. 0.4–0.8 μm of compressive silicon nitride over 0.8–1.5 μ of oxide or BPSG, and a final patterned etch exposes contact pad locations.

Figure 4:
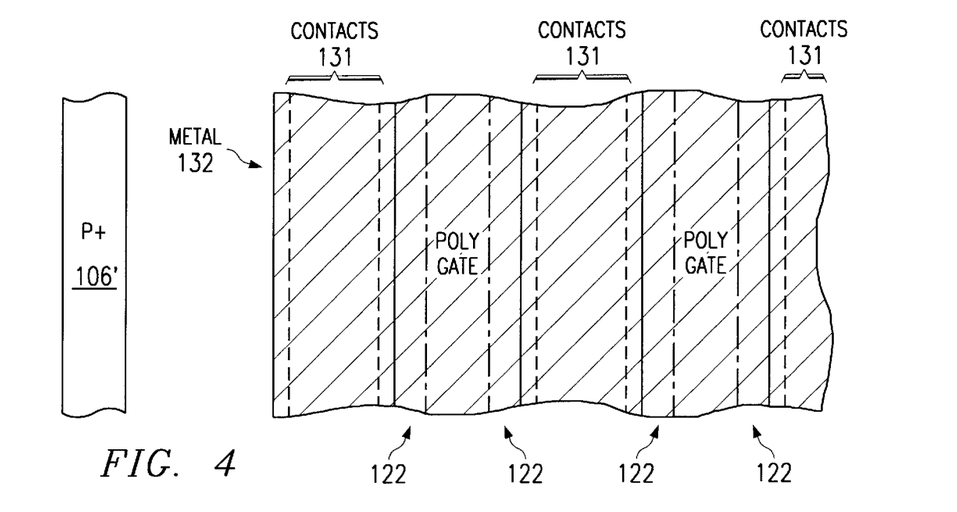
FIG. 4 is a plan view of a transistor cell according to FIG. 1G.

The foregoing steps have produced the final structure shown in FIG. 1G. FIG. 4 is a plan view of a transistor cell according to FIG. 1G.

Second Embodiment

FIGS. 2A–2G show a second sample embodiment. Implementation of many fabrication details is similar to that of the first embodiment, so it is primarily the exceptions which will be noted.

Figure 2A:
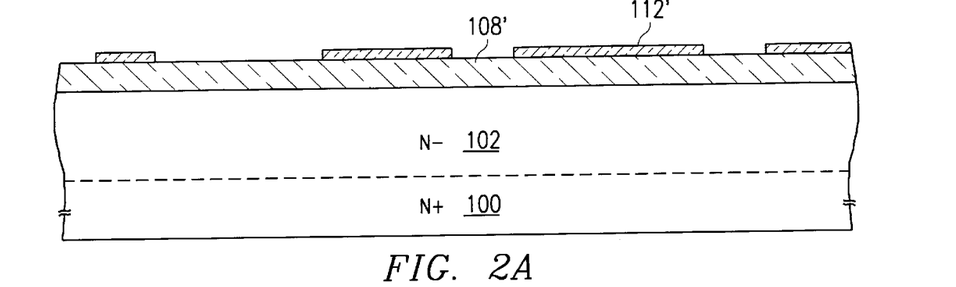
FIGS. 2A–2G show process steps in a second sample innovative embodiment.

FIG. 2A shows a starting epitaxial structure. Note that field oxide 104 is not used. Instead a nitride/oxide LOCOS stack 112'/108' is formed and patterned directly over the entire the epitaxial layer 102. The openings in the LOCOS stack expose not only desired drain locations, but also the locations of an isolation oxide.

Figure 2B:
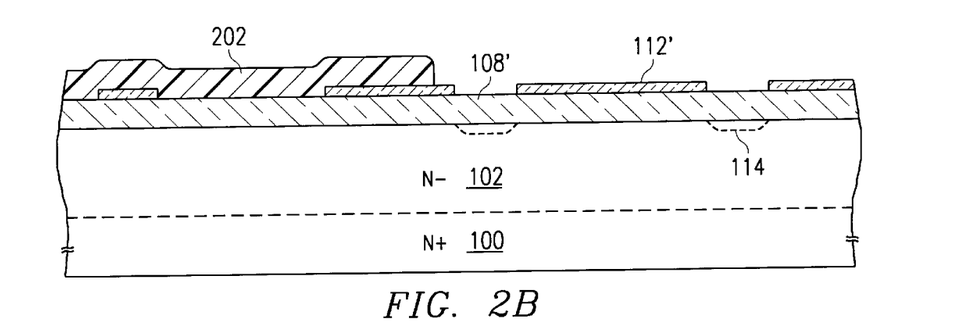

A patterned photoresist 202 is now used to cover the isolation oxide locations, and an n-type implant now forms diffusions 114 under the apertures of the nitride layer 112'.

Note that this second embodiment has reversed the order of the two n-type implants performed at the beginning of the first embodiment. The doses, energies and species of these implants may be chosen with the same considerations as discussed above and below regarding the first embodiment and its modifications.

The foregoing steps have produced the intermediate structure shown in FIG. 2B.

Figure 2C:
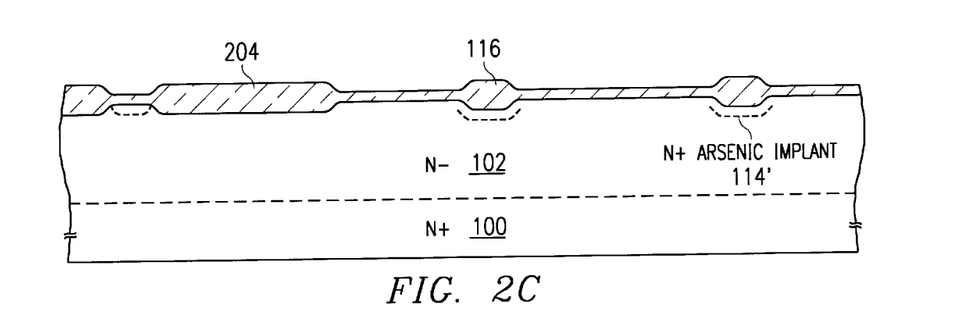

The photoresist 202 is then stripped, and an oxidation step forms LOCOS oxides 116 described above. At the same time this oxidation step forms isolation oxides 204, with the same thickness as LOCOS oxides 116, in peripheral locations where the nitride 112' has been removed. (These isolation oxides 204 serve essentially the same function as the field oxide 104 in the first embodiment.)

As noted above, this oxidation step also modifies the profile of diffusion 114, to produce a modified diffusion 114'.

The nitride 112' is then stripped.

The foregoing steps have produced the intermediate structure shown in FIG. 2C.

Figure 2D:
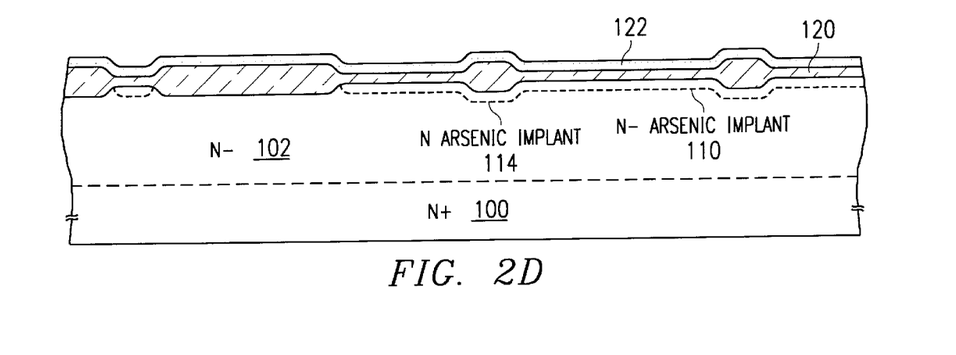

The remaining pad oxide 108' is then stripped, and a gate oxide 120 is then grown.

Another n-type implant is now performed, to form an added surface doping concentration 110.

Polysilicon 122 is then deposited.

The foregoing steps have produced the intermediate structure shown in FIG. 2D.

Figure 2E:
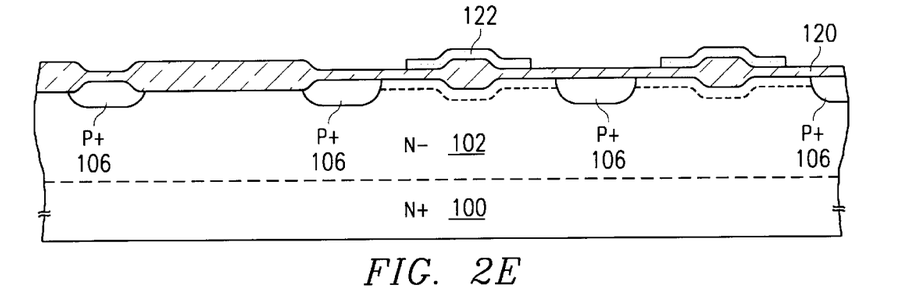

The polysilicon layer 122 is then patterned and etched.

A photoresist layer is then patterned to expose desired deep-body locations, and boron is implanted to form p+ diffusions 106. These diffusions will provide deep-body diffusions and (in the periphery) guard-ring diffusions. The photoresist is then stripped.

The foregoing steps have produced the intermediate structure shown in FIG. 2E.

Figure 2F:
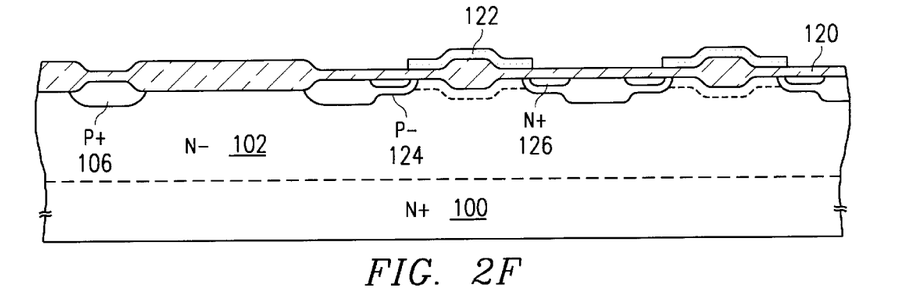

A global p− implant is then performed, and a patterned n+ source implant, to form source and body regions 126 and 124.

The foregoing steps have produced the intermediate structure shown in FIG. 2F.

Interlevel dielectric 130, metal 132, and passivation layer 134 are then each successively deposited and patterned. This results in the final structure shown in FIG. 2G.

Integrated Structure

Figure 2G:
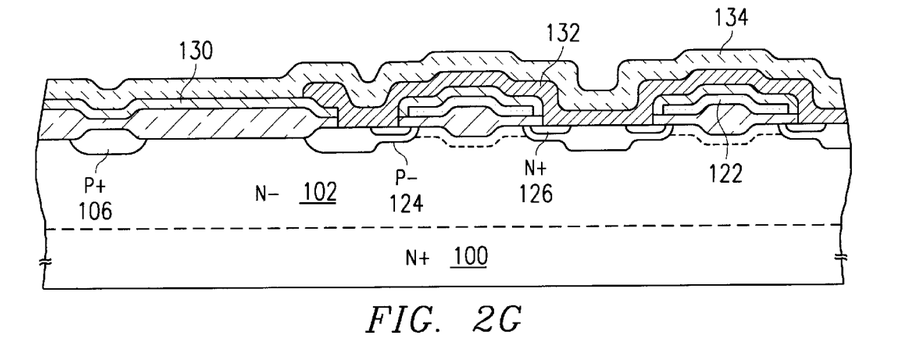
Figure 5A:
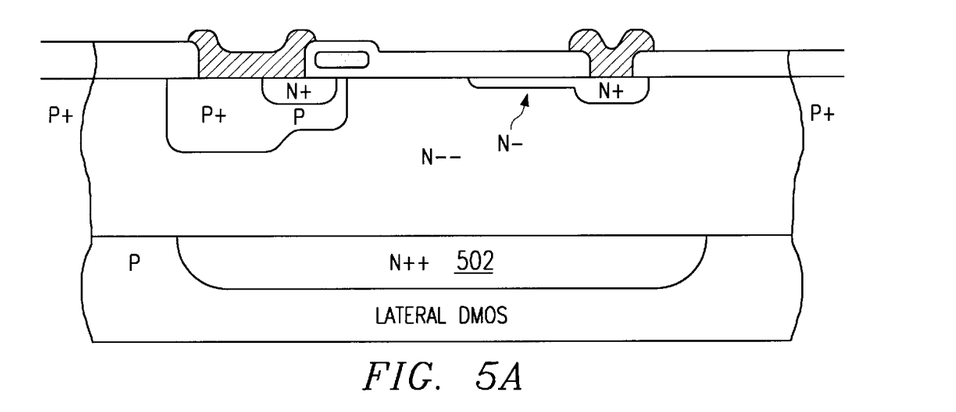
FIGS. 5A–5C show other devices which are combined with a power device like that of FIGS. 1G or 2G in a sample integrated process and structure.
Figure 5B:
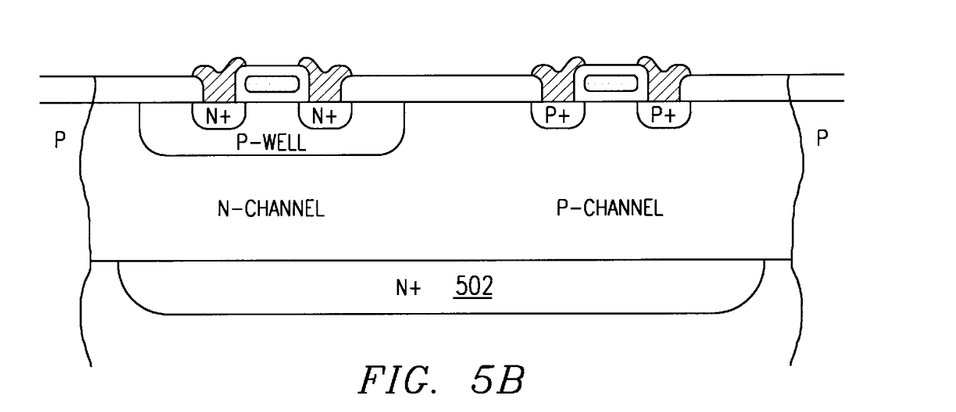
Figure 5C:
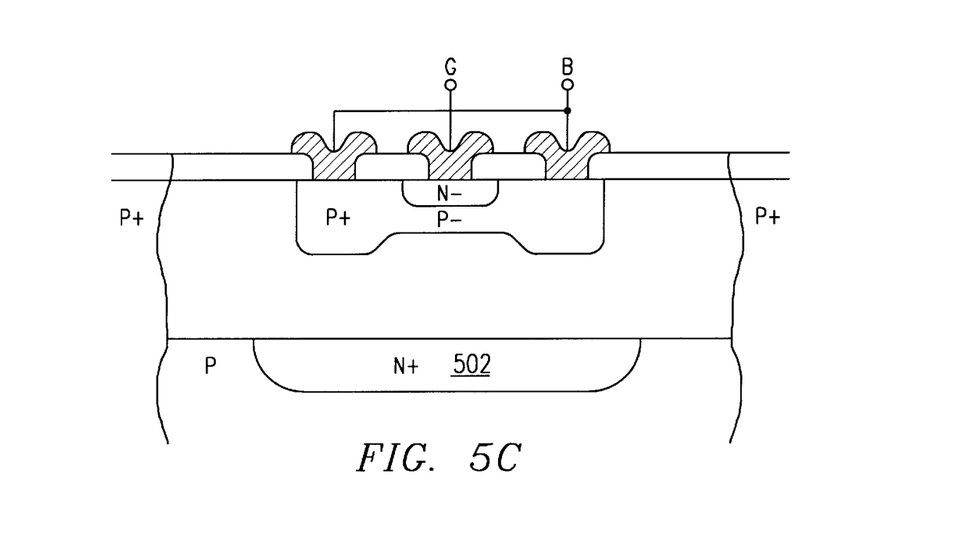

FIGS. 5A–5C show other devices which are combined with a power device like that of FIG. 1G or 2G in a sample integrated process and structure. In this embodiment a buried layer 502, contacted through an n-type reachup diffusion, provides the drain contact (instead of the backside drain contact preferably used in the embodiments of FIGS. 1G and 2G).

FIG. 5A shows an LDMOS (lateral DMOS) device; note that the shallow n− added doping contributions which are used in the VDMOS device are also advantageously used in the LDMOS device, to provide lightly doped drain extension (LDD) regions. (Such LDD regions reduce the peak electric field near the drain boundary, which can cause hot carrier generation.) FIG. 5B shows how small-signal NMOS and PMOS devices are manufactured in the same process, permitting conventional CMOS transistors to be integrated for control functions (or even for analog functions). FIG. 5C shows how an npn bipolar device can be manufactured in the same process; note that this device uses the buried layer 502 for collector contact.

According to a disclosed class of innovative embodiments, there is provided: A solid-state field-effect power semiconductor device, comprising: a source diffusion which is shallow and heavily doped with a first conductivity type, and body and deep-body diffusions of a second conductivity type which surround said source diffusion; a conductive gate which is capacitively coupled, through a gate dielectric, to a portion of said body diffusion at said first surface to define a channel region therein, said channel region being located in lateral proximity to a drain conduction region which extends downward to connect to a drain contact diffusion which is heavily doped with said first conductivity type; a local grown oxide, encroaching into said first surface over said drain conduction region, which is thicker than said gate dielectric; and a drain extension diffusion of said first conductivity type at said first surface, extending from said source region into said drain conduction region below said local grown oxide, and providing reduced resistance to current flow between said source region and said drain contact diffusion.

According to another disclosed class of innovative embodiments, there is provided: A solid-state power device, comprising: a substrate which includes substantially monolithic semiconductor material having a first conductivity type at a first surface thereof; a source diffusion, in proximity to said first surface, which is shallow and heavily doped with said first conductivity type; a body diffusion, in proximity to said first surface, which is deeper than said source diffusion and doped with a second conductivity type; a deep-body diffusion, in proximity to said first surface, which is doped with said second conductivity type and has a depth which is more than the depth of said source diffusion, said source diffusion being surrounded by the combination of said body and deep-body diffusions; an insulated conductive gate which is capacitively coupled to a portion of said body diffusion, at said first surface, to define a channel region therein, said channel region being located in lateral proximity to a drain conduction region which extends downward to connect to a drain contact diffusion which is heavily doped with said first conductivity type; an additional concentration of dopants of said first conductivity type at said first surface, overlying said source and channel regions and at least part of the surface of said drain conduction region to provide reduced resistance to lateral current flow between said channel region and said drain conduction region; a local grown oxide, encroaching into said first surface over said drain conduction region, which is thicker than the insulation over said channel region; and a further concentration of dopants of said first conductivity type, underlying said grown oxide, which is shallower than said deep-body diffusion and provides reduced resistance to current flow in said drain conduction region.

According to another disclosed class of innovative embodiments, there is provided: A solid-state power device, comprising: a substrate which includes substantially monolithic semiconductor material having a first conductivity type at a first surface thereof; a source diffusion, in proximity to said first surface, which is shallow and heavily doped with said first conductivity type; a body diffusion, in proximity to said first surface, which is deeper than said source diffusion and doped with a second conductivity type; a deep-body diffusion, in proximity to said first surface, which is doped with said second conductivity type and has a depth which is more than the depth of said source diffusion, said source diffusion being surrounded by the combination of said body and deep-body diffusions; an insulated conductive gate which is capacitively coupled to a portion of said body diffusion, at said first surface, to define a channel region therein, said channel region being located in lateral proximity to a drain conduction region which extends downward to connect to a drain contact diffusion which is heavily doped with said first conductivity type; a local grown oxide, encroaching into said first surface over said drain conduction region, which is thicker than the insulation over said channel region; and a firer concentration of dopants of said first conductivity type, underlying said grown oxide, which is shallower than said deep-body diffusion and provides reduced resistance to current flow in said drain conduction region.

According to another disclosed class of innovative embodiments, there is provided: A solid-state power device, comprising: a substrate which includes substantially monolithic semiconductor material having a first conductivity type at a first surface thereof; a source diffusion, in proximity to said first surface, which is shallow and heavily doped with said first conductivity type; a body diffusion, in proximity to said first surface, which is deeper than said source diffusion and doped with a second conductivity type; a deep-body diffusion, in proximity to said first surface, which is doped with said second conductivity type and has a depth which is more than the depth of said source diffusion, said source diffusion being surrounded by the combination of said body and deep-body diffusions; an insulated conductive gate which is capacitively coupled to a portion of said body diffusion, at said first surface, to define a channel region therein, said channel region being located in lateral proximity to a drain conduction region which extends downward to connect to a drain contact diffusion which is heavily doped with said first conductivity type; and an additional concentration of dopants of said first conductivity type at said first surface, overlying said source and channel regions and at least part of the surface of said drain conduction region to provide reduced resistance to lateral current flow between said channel region and said drain conduction region.

According to another disclosed class of innovative embodiments, there is provided: A method for fabricating power field-effect transistors, comprising the steps of: providing a substrate which includes at least one substantially monolithic body of semiconductor material having a first conductivity type at a first surface thereof; forming, in proximity to said first surface, a source diffusion which is shallow and heavily doped with said first conductivity type; forming, in proximity to said first surface, a body diffusion which is doped with a second conductivity type at a net concentration which is less than the net dopant concentration of said source diffusion; forming, in proximity to said first surface, a deep-body diffusion which is doped with said second conductivity type and has a depth which is more than the depth of said source diffusion, said source diffusion being surrounded by the combination of said body and deep-body diffusions; forming an insulated conductive gate which is capacitively coupled to said body diffusion, at said first surface, to define a channel region therein, said channel region being located in lateral proximity to a drain conduction region which extends downward to connect to a drain contact diffusion which is heavily doped with said first conductivity type; providing an additional concentration of dopants of said first conductivity type at said first surface to provide reduced resistance to lateral current flow between said channel region and drain conduction region; providing a grown oxide, at said first surface over said drain conduction region, which is thicker than the insulation over said channel region; and providing, under said grown oxide, a further concentration of dopants of said first conductivity type to provide reduced resistance to current flow in said drain conduction region.

According to another disclosed class of innovative embodiments, there is provided: A method for fabricating power field-effect transistors, comprising the steps of: providing a substrate which includes at least one substantially monolithic body of semiconductor material having a first conductivity type at a first surface thereof; forming, in proximity to said first surface, a source diffusion which is shallow and heavily doped with said first conductivity type; forming, in proximity to said first surface, a body diffusion which is doped with a second conductivity type at a net concentration which is less than the net dopant concentration of said source diffusion; forming, in proximity to said first surface, a deep-body diffusion which is doped with said second conductivity type and has a depth which is more than the depth of said source diffusion, said source diffusion being surrounded by the combination of said body and deep-body diffusions; forming an insulated conductive gate which is capacitively coupled to said body diffusion, at said first surface, to define a channel region therein, said channel region being located in lateral proximity to a drain conduction region which extends downward to connect to a drain contact diffusion which is heavily doped with said first conductivity type; providing a grown oxide, at said first surface over said drain conduction region, which is thicker than the insulation over said channel region; and providing, under said grown oxide, a further concentration of dopants of said first conductivity type to provide reduced resistance to current flow in said drain conduction region.

According to another disclosed class of innovative embodiments, there is provided: A method for fabricating power field-effect transistors, comprising the steps of: providing a substrate which includes at least one substantially monolithic body of semiconductor material having a first conductivity type at a first surface thereof; forming, in proximity to said first surface, a source diffusion which is shallow and heavily doped with said first conductivity type; forming, in proximity to said first surface, a body diffusion which is doped with a second conductivity type at a net concentration which is less than the net dopant concentration of said source diffusion; forming, in proximity to said first surface, a deep-body diffusion which is doped with said second conductivity type and has a depth which is more than the depth of said source diffusion, said source diffusion being surrounded by the combination of said body and deeply diffusions; forming an insulated conductive gate which is capacitively coupled to said body diffusion, at said first surface, to define a channel region therein, said channel region being located in lateral proximity to a drain conduction region which extends downward to connect to a drain contact diffusion which is heavily doped with said first conductivity type; and providing an additional concentration of dopants of said first conductivity type at said first surface to provide reduced resistance to lateral current flow between said channel region and drain conduction region.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

Of course, the foregoing examples can be modified in accordance with various design rules understood by those skilled in the art of power device design. (See generally, e.g., Fuoss, "Vertical DMOS power field-effect transistors optimised for high-speed operation," 1982 IEDM 250, which is hereby incorporated by reference; Grant and Gowar, POWER MOSFETS: THEORY AND APPLICATIONS at Appendices 5 and 6 (1989); and B. J. Baliga, MODERN POWER DEVICES at 273ff and 291ff (1987).) For example, the deep-body depths and spacing are preferably chosen, in relation to the epitaxial layer's depth and doping, so that depletion boundaries from the body potential will pinch off the channel of the parasitic JFET (and thus protect the channel from high voltages) at a voltage below that at which the channel and body diffusions suffer breakdown. For another example, the need to avoid field-plate-induced breakdown implies limits on the maximum concentration of both the added n-type diffusions.

For another example, the disclosed structural modifications can also be combined with other structural modifications, such as those disclosed in copending application Ser. No. 08/380,725 filed Jan. 30, 1995 (Zambrano, Process for Manufacturing Integrated Circuit with Power Field Effect Transistors), which is hereby incorporated by reference.

For another example, in the illustrated embodiment, the source and channel are both self-aligned to the edge of the gate. In another class of modifications, sidewall oxide or nitride can be used self-align the source (or alternatively the source and the channel) to a point which provides slightly more gate underlap.

For another example, as will be obvious to those of ordinary skill in the art, a P-channel device can easily be fabricated by reversing the doping type of every region of the device.

For another example, as will be obvious to those of ordinary skill in the art, some or all of the arsenic implants can be replaced by antimony implants, and other changes of dopant species can also be performed.

For another example, the disclosed structure can also (alternatively and less preferably) be modified in various ways to produce a hybrid field-effect/bipolar device with reduced on-resistance.

For another example, the disclosed structure can be combined with an additional p-type buried layer (and preferably an additional n-type buried layer above that) to form a switched emitter device, in which the FET device illustrated controls current to a buried-emitter bipolar device which provides high-voltage withstand capability.

For another example, although the disclosed structure and process are directed to fabrication of discrete transistors, it is possible to modify this process to produce integrated devices. However, an integrated process would not be as simple and economical as the disclosed process.

What is claimed is:

1. A solid-state power device, comprising:
   a substrate which includes substantially monolithic semiconductor material having a first conductivity type at a first surface thereof;
   a source diffusion, in proximity to said first surface, which is shallow and heavily doped with said first conductivity type;
   a body diffusion, in proximity to said first surface, which is deeper than said source diffusion and doped with a second conductivity type;
   a deep-body diffusion, in proximity to said first surface, which is doped with said second conductivity type and has a depth which is more than the depth of said source diffusion, said source diffusion being surrounded by the combination of said body and deep-body diffusions;
   an insulated conductive gate which is capacitively coupled to a portion of said body diffusion, at said first surface, to define a channel region therein, said channel region being located in lateral proximity to a drain conduction region which extends downward to connect to a drain contact diffusion which is heavily doped with said first conductivity type;
   an additional concentration of dopants of said first conductivity type at said first surface, overlying said source and channel regions and at least part of the surface of said drain conduction region to provide reduced resistance to lateral current flow between said channel region and said drain conduction region;

an oxide, encroaching into said first surface over said drain conduction region, which is thicker than the insulation over said channel region; and a further additional concentration of dopants of said first conductivity type, underlying and self-aligned to said oxide, the further additional concentration of dopants shallower than said deep-body diffusion and providing additional reduced resistance to current flow in said drain conduction region.

2. The device of claim 1, wherein said semiconductor material consists of silicon.

3. The device of claim 1, wherein said first conductivity type is N-type.

4. The device of claim 1, wherein said body diffusion is laterally self-aligned to said source diffusion.

5. The device of claim 1, wherein said body diffusion is doped with said second conductivity type at a net concentration which is less than one tenth of the net dopant concentration of said source diffusion.

* * * * *